(12) United States Patent
Oh et al.

(10) Patent No.: US 11,550,230 B2
(45) Date of Patent: Jan. 10, 2023

(54) SUBSTRATE DEFORMING DEVICE FOR PROXIMITY EXPOSURE, AND SUBSTRATE DEFORMING METHOD FOR PROXIMITY EXPOSURE USING SAME

(71) Applicant: INDUSTRY-UNIVERSITY COOPERATION FOUNDATION HANYANG UNIVERSITY ERICA CAMPUS, Ansan-si (KR)

(72) Inventors: Je Hoon Oh, Anyang-si (KR); Changkyu Lee, Gwangmeyong-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 0 days.

(21) Appl. No.: 17/514,209

(22) Filed: Oct. 29, 2021

(65) Prior Publication Data
US 2022/0050390 A1 Feb. 17, 2022

Related U.S. Application Data

(63) Continuation of application No. PCT/KR2020/005412, filed on Apr. 24, 2020.

(30) Foreign Application Priority Data

Apr. 30, 2019 (KR) .................. 10-2019-0050944

(51) Int. Cl.
G03F 7/20 (2006.01)
(52) U.S. Cl.
CPC ........ *G03F 7/70775* (2013.01); *G03F 7/2053* (2013.01); *G03F 7/707* (2013.01); *G03F 7/70441* (2013.01)

(58) Field of Classification Search
CPC ............... G03F 7/70775; G03F 7/2053; G03F 7/70441; G03F 7/707; G03F 7/7035;
(Continued)

(56) References Cited

U.S. PATENT DOCUMENTS

| 5,737,064 | A | * | 4/1998 | Inoue | G03F 7/70783 355/73 |
| 9,897,927 | B2 | * | 2/2018 | Fresquet | G03F 9/703 |
| 10,437,161 | B2 | * | 10/2019 | Wang | G03F 7/70775 |

FOREIGN PATENT DOCUMENTS

| JP | 09-129548 A | 5/1997 |
| JP | 2879709 B2 | 4/1999 |

(Continued)

OTHER PUBLICATIONS

International Search Report for PCT/KR2020/005412 dated Aug. 3, 2020 [PCT/ISA/210].
(Continued)

*Primary Examiner* — Hung V Nguyen
(74) *Attorney, Agent, or Firm* — Sughrue Mion, PLLC

(57) ABSTRACT

Provided is a substrate deforming device for proximity exposure, the device comprising: a mask holder for holding an exposure mask; a first plate which is spaced apart from the exposure mask in a certain direction, and holds a to-be-exposed substrate; a position adjustment part for adjusting the position of the exposure mask; a gap adjustment part for adjusting a gap between the exposure mask and the to-be-exposed substrate; a first sensor for measuring the position of at least one among the exposure mask and the to-be-exposed substrate; a second sensor for measuring the gap between the exposure mask and the to-be-exposed substrate; and a control unit which performs a first control according to the measurement result from the first sensor, and after the first control, performs a second control according to the measurement result from the second sensor. The
(Continued)

first control reduces the relative distance between the exposure mask and the to-be-exposed substrate by means of the position adjustment part. The second control deforms the to-be-exposed substrate by means of the gap adjustment part in response to deflection of the exposure mask.

13 Claims, 11 Drawing Sheets

(58) Field of Classification Search
CPC ...... G03F 7/20; G03F 7/70783; G03F 7/7085; G03F 7/2063; G03F 7/706; G03F 7/70616; G03F 7/70991
See application file for complete search history.

(56) References Cited

FOREIGN PATENT DOCUMENTS

| | | |
|---|---|---|
| JP | 3940823 B2 | 7/2007 |
| KR | 1990-0008782 B1 | 11/1990 |
| KR | 10-1999-0054768 A | 7/1999 |
| KR | 10-2004-0087142 A | 10/2004 |
| KR | 10-2016-0033840 A | 3/2016 |
| KR | 10-2019-0012697 A | 2/2019 |

OTHER PUBLICATIONS

Written Opinion for PCT/KR2020/005412 dated Aug. 3, 2020 [PCT/ISA/237].

* cited by examiner

[Fig. 1]
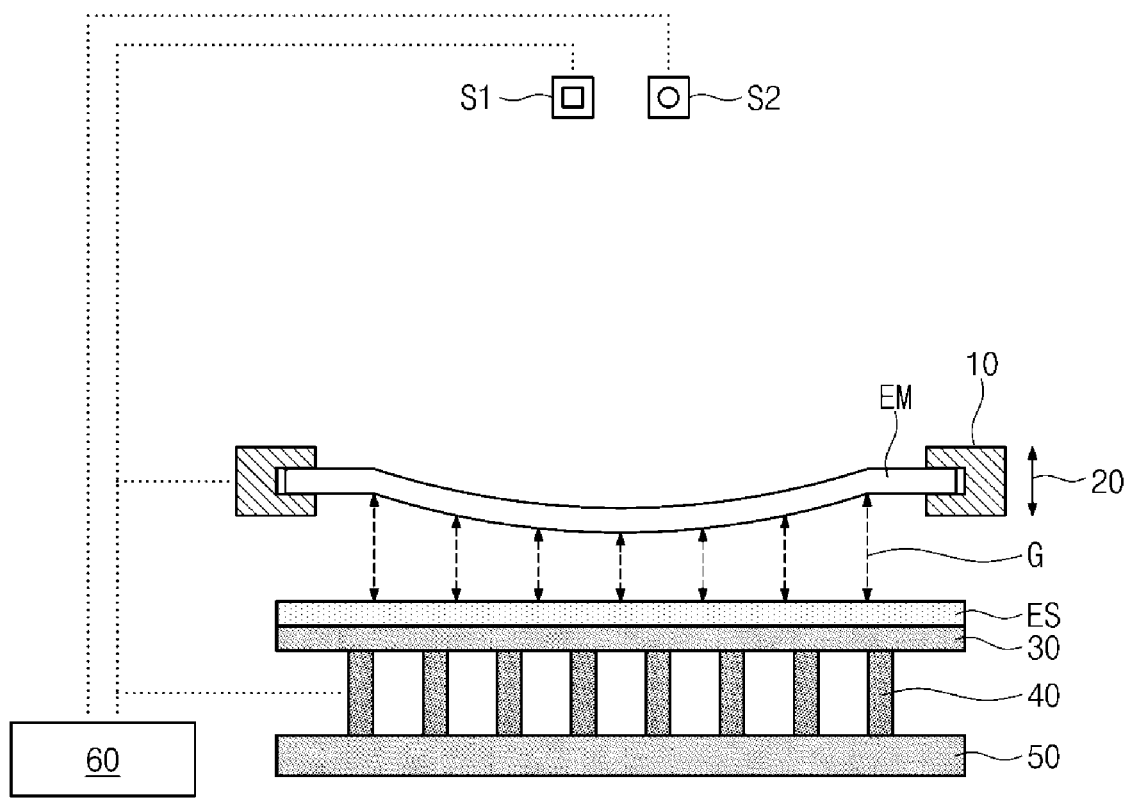

[Fig. 2]
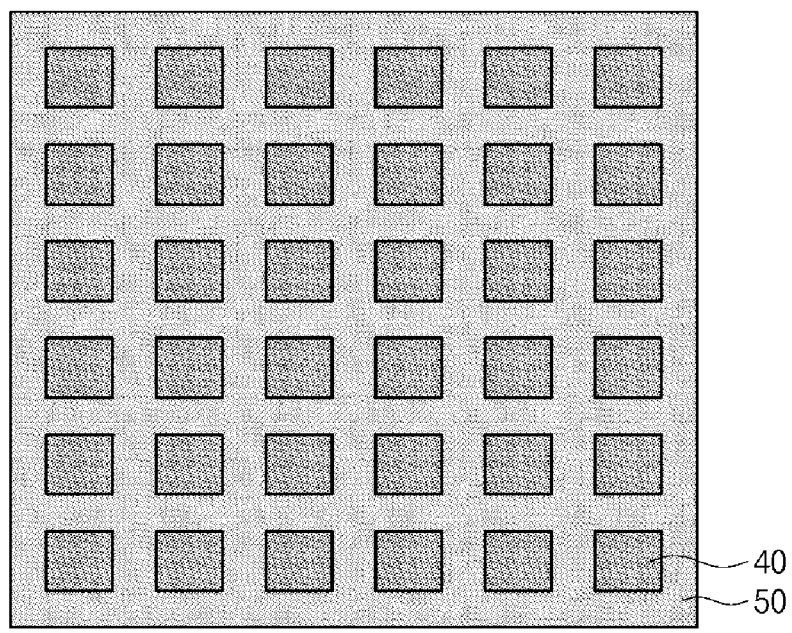

[Fig. 3]
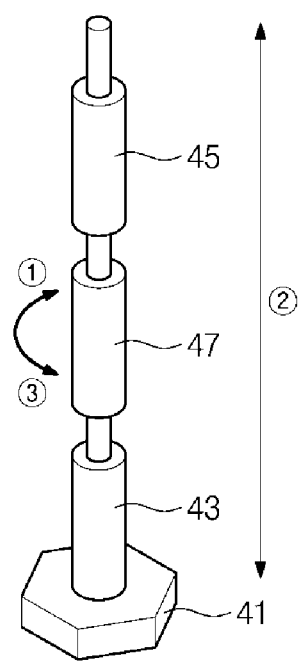

[Fig. 4]
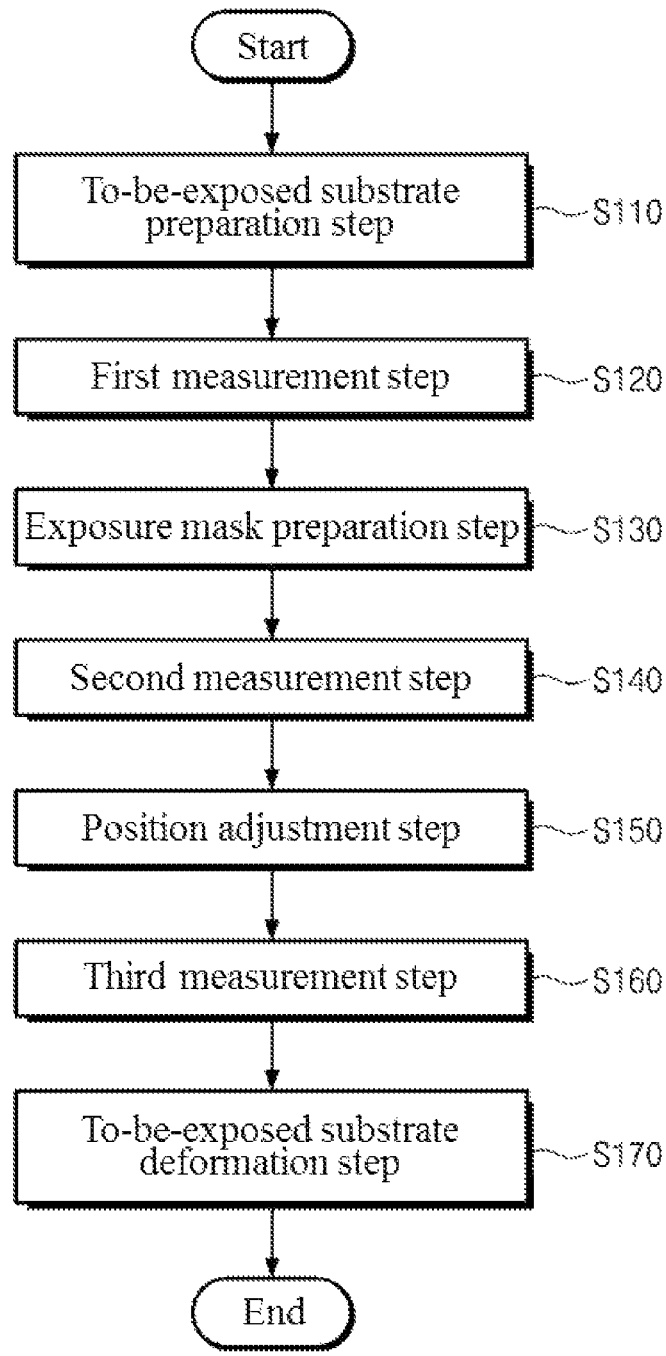

【Fig. 5】
S110~S120
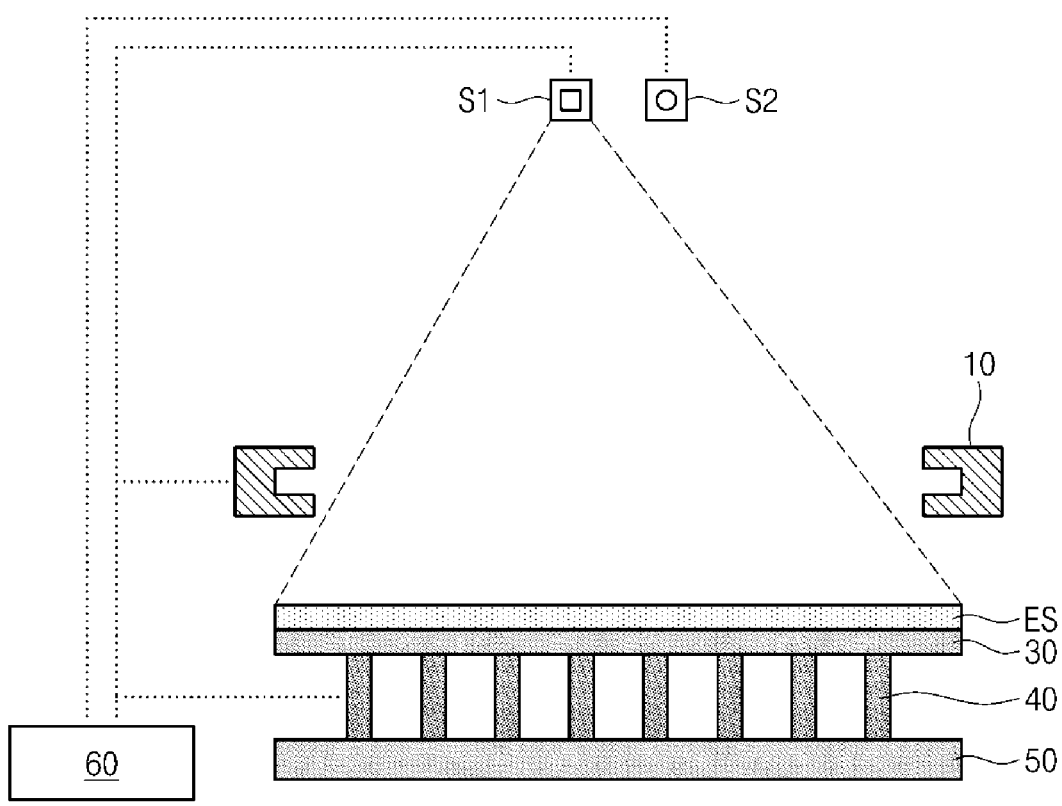

[Fig. 6]
S130~S140
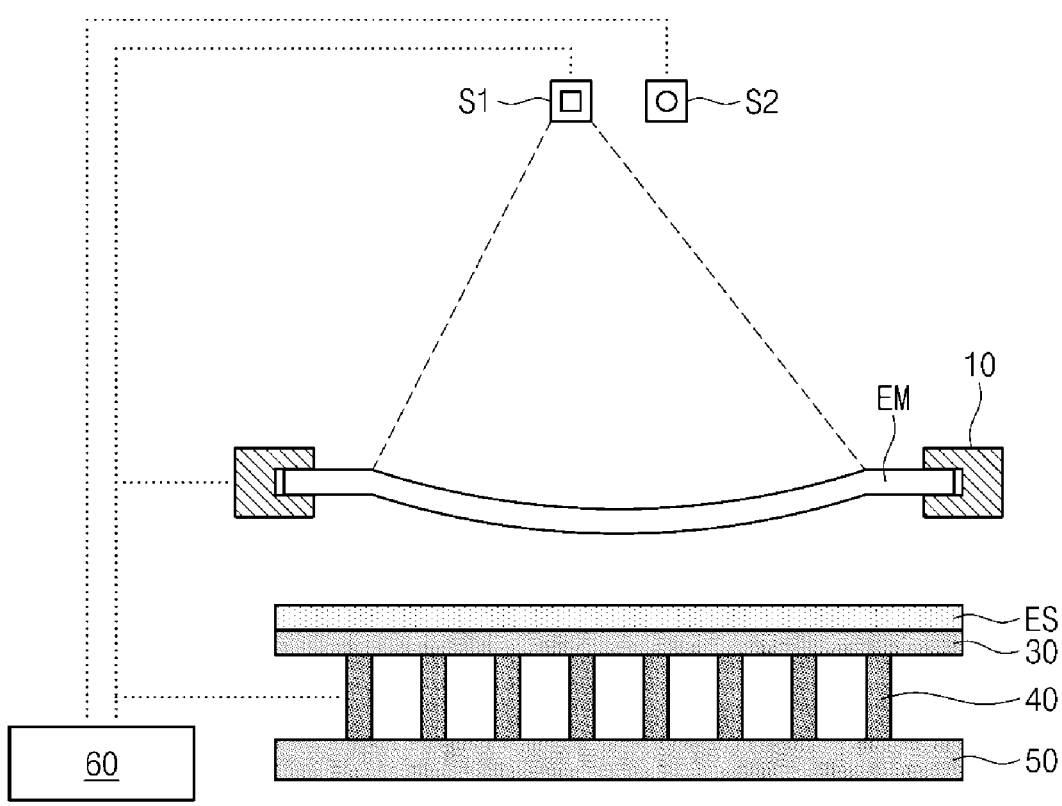

[Fig. 7]
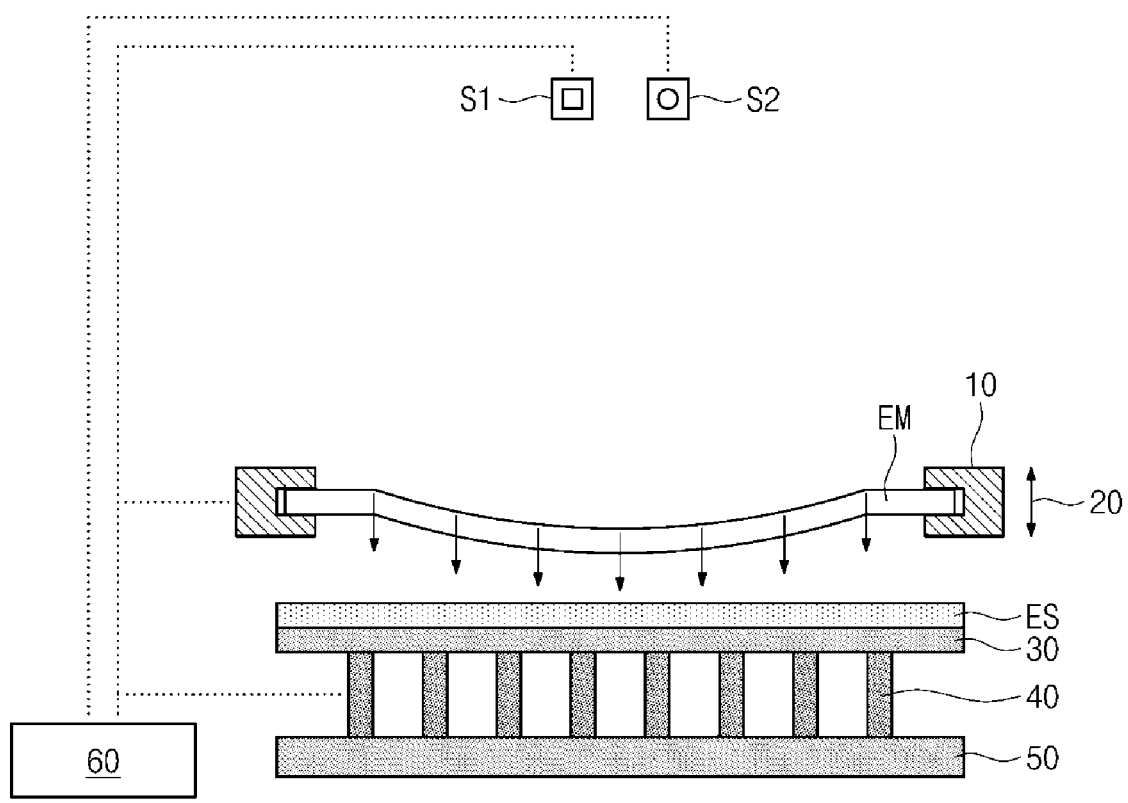

[Fig. 8]
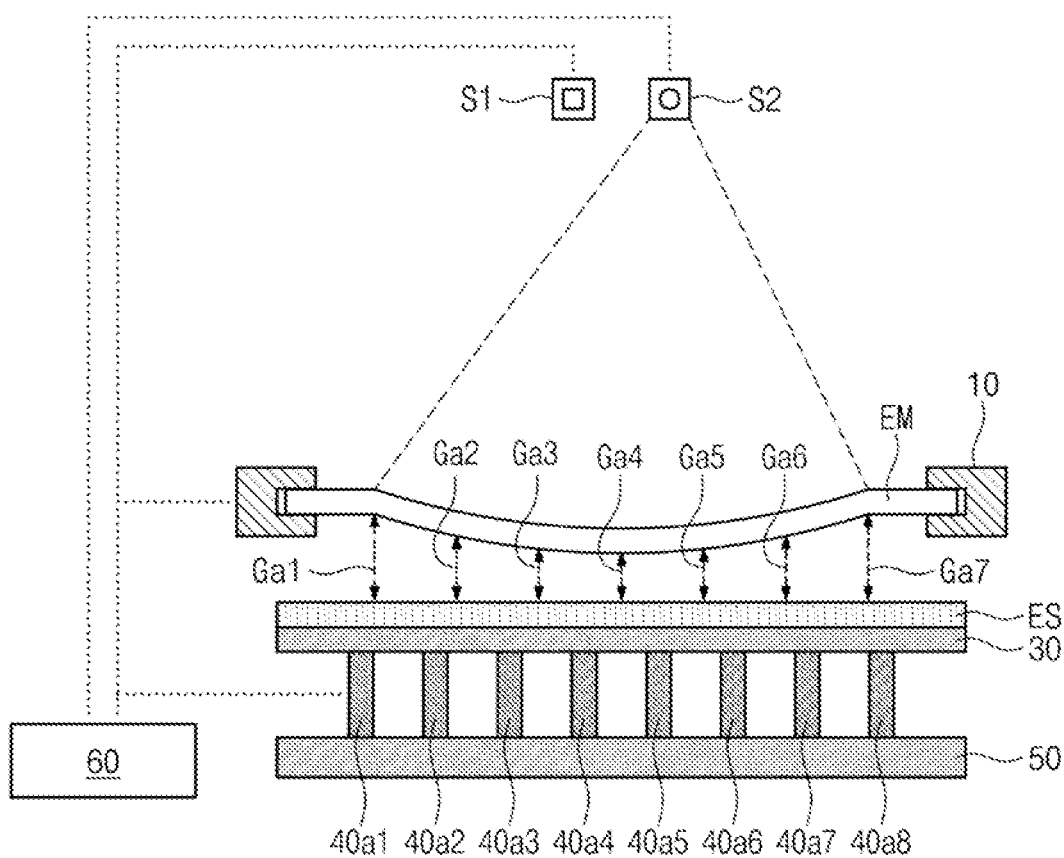

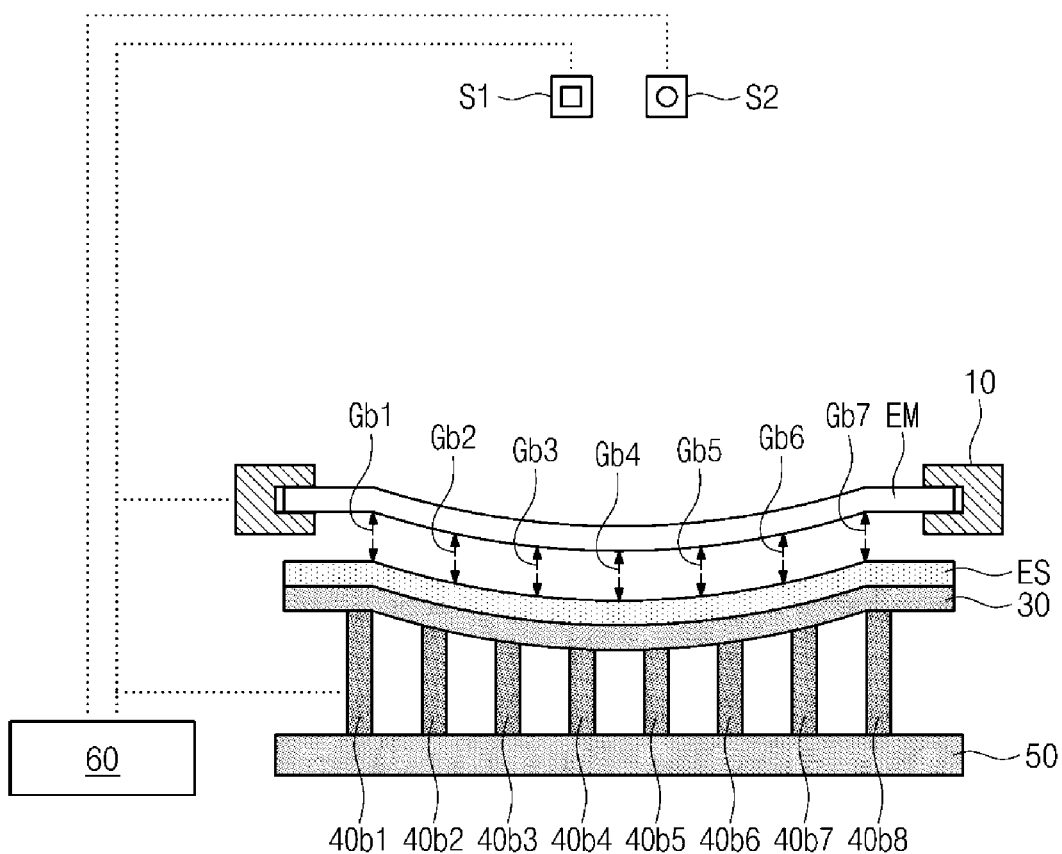
[Fig. 9]

[Fig. 10]
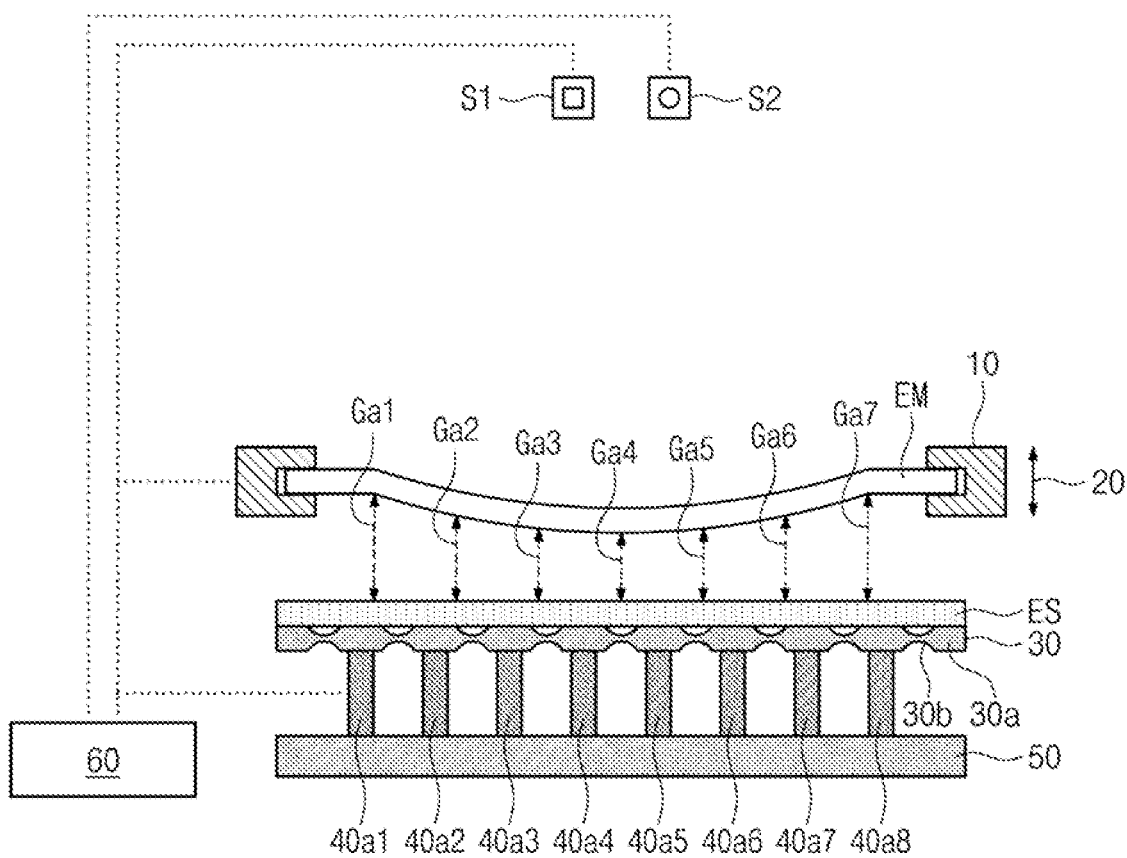

[Fig. 11]
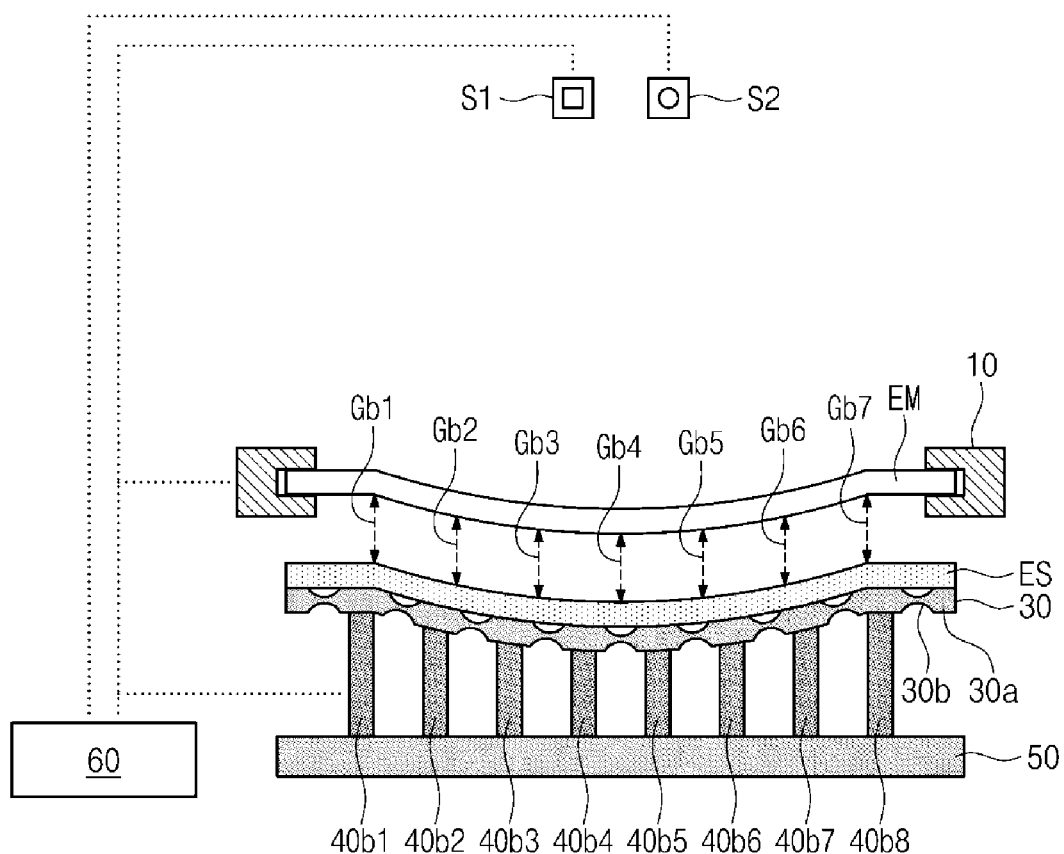

SUBSTRATE DEFORMING DEVICE FOR PROXIMITY EXPOSURE, AND SUBSTRATE DEFORMING METHOD FOR PROXIMITY EXPOSURE USING SAME

TECHNICAL FIELD

The present invention relates to a substrate deforming device for proximity exposure, and a substrate deforming method for proximity exposure using the same, and more particularly, to a substrate deforming device for proximity exposure, and a substrate deforming method for proximity exposure using the same, capable of deforming a to-be-exposed substrate so that a gap between an exposure mask and the to-be-exposed substrate is constant in a plane direction of the exposure mask.

BACKGROUND ART

A photolithography process is a fine pattern forming technique that is widely used in the manufacture of semiconductor devices, printed electronic circuits, display panels, and the like. In order to form a fine pattern, the photolithography process may include a series of processes such as a coating step, an exposure step, a development step, and an etching step.

In the exposure step of the photolithography process, a mask having a fine pattern may be provided on a substrate or a wafer coated with a photoresist, and light may be irradiated, so that the fine pattern of the mask may be transferred to the substrate or the wafer coated with the photoresist.

Since the light is irradiated in the exposure step, the photoresist of the substrate or the wafer may cause a photochemical reaction, so that physical properties of the photoresist may be changed.

Thereafter, the development step and the etching step may be performed to leave or remove only a portion of the photoresist having the changed physical properties, so that the fine pattern may be formed on the substrate or the wafer.

The exposure step may be classified into a contact type, a projection type, and a proximity type according to a separation distance between the substrate or the wafer and the mask.

The contact-type exposure may be performed such that parallel light is irradiated in a state where the substrate or the wafer makes contact with the mask. The contact-type exposure may have a simple structure and may implement high pattern precision, while the contact-type exposure may have a disadvantage in that corrosion or damage may be caused by the contact.

The projection-type exposure may be performed such that a projection lens is provided at a gap between the substrate or the wafer and the mask to allow light passing through the mask to be irradiated to the wafer through the projection lens. According to the projection-type exposure, the pattern of the mask may be reduced and transferred onto the substrate or the wafer through the projection lens, so that the projection-type exposure may form a finer pattern than the contact-type exposure described above. However, since a device for the projection-type exposure requires a complex optical system including the projection lens, the device for the projection-type exposure may be expensive, amounting to tens of billions, and productivity may be decreased by a reduced exposure region.

The proximity-type exposure may be performed such that parallel light is irradiated in a state where a separation distance between the substrate or the wafer and the mask is maintained at hundreds of μms. Unlike the contact-type exposure and the projection-type exposure described above, the proximity-type exposure may not have a problem caused by contact, and the proximity-type exposure has been used in various fields such as a display, a PCB, and a MEMS due to advantages in terms of productivity and a cost.

For example, Korean Patent Registration KR101432888B1 discloses a method of exposing an entire surface of a substrate with a pattern formed on a mask by repeatedly performing, over the entire surface of the substrate, irradiating exposure light emitted from a light source to the mask having the pattern that transmits light with an optical system interposed therebetween, and projecting a portion of the exposure light irradiated to the mask, which is transmitted through the pattern, onto a resist applied to a first region of the substrate disposed in proximity to the mask so as to expose the resist, wherein the irradiating of the exposure light to the mask is performed by converting the exposure light emitted from the light source into a plurality of point light sources by transmitting the exposure light through an optical integrator, converting the exposure light transmitted through the optical integrator and converted into the point light sources into parallel light by a collimating mirror, and reflecting the exposure light converted into the parallel light by a plane mirror provided on a rear surface thereof with actuators arranged in a two-dimensional shape so as to irradiate the exposure light to the mask; and each individual actuator of the actuators arranged in the two-dimensional shape on the rear surface of the plane mirror is controlled based on information about the point light sources of the optical integrator, which is acquired from an image obtained by picking up, by an image pickup camera, an image projected on a visual scale guide through a pinhole of a pinhole camera that includes the pinhole formed at a position corresponding to a surface of the substrate to be exposed, the visual scale guide, and the image pickup camera.

Recently, a technique of increasing a size of an entire screen while decreasing a size of a pattern of each individual pixel is being required in the display field. However, the conventional proximity-type exposure scheme meets the technical limitations in coping with the above technique.

Such technical limitations arise because in the case of the proximity-type exposure, as the separation distance between the substrate or the wafer and the mask increases, diffraction occurs so as to decrease patterning resolution, so that in a case of a mask having a large area, as an amount of deflection of the mask caused by a weight thereof increases, a deviation of the separation distance between the mask and the substrate or the wafer is increased over an entire exposure area. Therefore, the patterning resolution may be decreased by such a deviation of the separation distance.

In addition, since no element should exist on an optical path provided at the gap between the substrate or the wafer and the mask, it is difficult to directly control the deflection of the large-area mask caused by the weight thereof.

DISCLOSURE

Technical Problem

One technical object of the present invention is to provide a substrate deforming method for proximity exposure, capable of deforming a to-be-exposed substrate in consideration of deflection of an exposure mask caused by a weight of the exposure mask.

Another technical object of the present invention is to provide a substrate deforming method for proximity exposure, capable of adjusting a position of at least one of the exposure mask and the to-be-exposed substrate so that a relative distance between the exposure mask and the to-be-exposed substrate becomes a predetermined distance by measuring the position of the to-be-exposed substrate, and measuring the position of the exposure mask.

Still another technical object of the present invention is to provide a substrate deforming method for proximity exposure, capable of increasing uniformity of a gap between the exposure mask and the to-be-exposed substrate.

Yet another technical object of the present invention is to provide a substrate deforming method for proximity exposure, capable of improving patterning resolution.

Still yet another technical object of the present invention is to provide a substrate deforming device for proximity exposure, which includes a first plate formed of a material that is identical to a material of the exposure mask.

Another technical object of the present invention is to provide a substrate deforming device for proximity exposure, capable of controlling deformation of the first plate in a plane direction by adjusting a height of a gap adjustment part, and deforming the to-be-exposed substrate disposed on the first plate according to the control of the deformation of the first plate in the plane direction.

Still another technical object of the present invention is to provide a substrate deforming device for proximity exposure, which includes a plurality of gap adjustment parts provided in the plane direction of the first plate.

The technical objects of the present invention are not limited to the technical objects described above.

Technical Solution

In order to achieve the technical objects described above, the present invention provides a substrate deforming device for proximity exposure.

The substrate deforming device for the proximity exposure includes: a mask holder on which an exposure mask is mounted; a first plate spaced apart from the exposure mask in a predetermined direction, and on which a to-be-exposed substrate is mounted; a position adjustment part for adjusting a position of the exposure mask; a gap adjustment part for adjusting a gap between the exposure mask and the to-be-exposed substrate; a first sensor for measuring a position of at least one of the exposure mask and the to-be-exposed substrate; a second sensor for measuring the gap between the exposure mask and the to-be-exposed substrate; and a control unit for performing a first control of reducing a relative distance between the exposure mask and the to-be-exposed substrate through the position adjustment part according to a measurement result from the first sensor, and a second control of deforming the to-be-exposed substrate to correspond to deflection of the exposure mask through the gap adjustment part according to a measurement result from the second sensor after the first control.

According to one embodiment, the first control may include: acquiring the position of the to-be-exposed substrate through the first sensor in a state where the exposure mask is not mounted on the mask holder and the to-be-exposed substrate is mounted on the first plate; mounting the exposure mask on the mask holder, and acquiring the position of the exposure mask through the first sensor; and reducing a distance between the exposure mask and the to-be-exposed substrate direction through the position adjustment part so that the distance between the exposure mask and the to-be-exposed substrate becomes a predetermined distance.

According to one embodiment, the predetermined distance may be within a measurable distance of the second sensor.

According to one embodiment, when compared with a state before the second control, uniformity of the gap between the exposure mask and the to-be-exposed substrate may be increased after the second control.

According to one embodiment, the substrate deforming device may further include a second plate on which the gap adjustment part is located, wherein a plurality of gap adjustment parts may be provided between the first plate and the second plate in a plane direction of the first plate.

According to one embodiment, the second control may include controlling deformation of the first plate in the plane direction by adjusting a height of the gap adjustment part, and deforming the to-be-exposed substrate disposed on the first plate according to the control of the deformation of the first plate in the plane direction.

According to one embodiment, the first sensor may include a displacement sensor, and the second sensor may include a gap measurement sensor.

According to one embodiment, the first plate may be formed of a material that is identical to a material of the exposure mask.

According to one embodiment, the first plate may include a concave portion and a convex portion, which are alternately arranged in a plane direction of the first plate, and the gap adjustment part may make direct contact with the convex portion.

In order to achieve the technical objects described above, the present invention provides a substrate deforming method for proximity exposure.

According to one embodiment, the substrate deforming method for the proximity exposure includes: preparing a to-be-exposed substrate on a first plate; a first measurement step of measuring a position of the to-be-exposed substrate; preparing an exposure mask facing the to-be-exposed substrate; a second measurement step of measuring a position of the exposure mask; a position adjustment step of adjusting the position of at least one of the exposure mask and the to-be-exposed substrate so that a relative distance between the exposure mask and the to-be-exposed substrate becomes a predetermined distance according to measurement results of the first and second measurement steps; a third measurement step of measuring a gap between the exposure mask and the to-be-exposed substrate after the position adjustment step; and deforming the to-be-exposed substrate so that the gap between the exposure mask and the to-be-exposed substrate becomes constant in a plane direction of the exposure mask according to a measurement result of the third measurement step.

According to one embodiment, the first measurement step and the second measurement step may be performed by a displacement sensor, and the third measurement step may be performed by a gap measurement sensor.

According to one embodiment, the predetermined distance may be within a measurable distance of the gap measurement sensor.

According to one embodiment, uniformity of a gap between the exposure mask and the to-be-exposed substrate may be increased by the deforming of the to-be-exposed substrate.

According to one embodiment, the deforming of the to-be-exposed substrate may include deforming the to-be-exposed substrate to correspond to deflection of the exposure mask.

Advantageous Effects

According to an embodiment of the present invention, there is provided a substrate deforming device for proximity exposure, the substrate deforming device including: a mask holder on which an exposure mask is mounted; a first plate spaced apart from the exposure mask in a predetermined direction, and on which a to-be-exposed substrate is mounted; a position adjustment part for adjusting a position of the exposure mask; a gap adjustment part for adjusting a gap between the exposure mask and the to-be-exposed substrate; a first sensor for measuring a position of at least one of the exposure mask and the to-be-exposed substrate; a second sensor for measuring the gap between the exposure mask and the to-be-exposed substrate; and a control unit for performing a first control of reducing a relative distance between the exposure mask and the to-be-exposed substrate through the position adjustment part according to a measurement result from the first sensor, and a second control of deforming the to-be-exposed substrate to correspond to deflection of the exposure mask through the gap adjustment part according to a measurement result from the second sensor after the first control.

Accordingly, the to-be-exposed substrate may be deformed to correspond to the deflection of the exposure mask caused by the weight of the exposure mask, so that the uniformity of the gap between the exposure mask and the to-be-exposed substrate can be increased. Therefore, the patterning resolution in the proximity exposure can be improved.

DESCRIPTION OF DRAWINGS

FIG. 1 is a view for describing a substrate deforming device for proximity exposure according to an embodiment of the present invention.

FIGS. 2 and 3 are views for describing a gap adjustment part according to an embodiment of the present invention.

FIG. 4 is a flowchart for describing a substrate deforming method for proximity exposure according to an embodiment of the present invention.

FIG. 5 is a view for describing steps S110 and S120 of the present invention.

FIG. 6 is a view for describing steps S130 and S140 of the present invention.

FIG. 7 is a view for describing a step S150 of the present invention.

FIG. 8 is a view for describing a step S160 of the present invention.

FIG. 9 is a view for describing a step S170 of the present invention.

FIGS. 10 and 11 are views for describing a modified example of the present invention.

MODE FOR INVENTION

Hereinafter, exemplary embodiments of the present disclosure will be described in detail with reference to the accompanying drawings. However, the technical idea of the present disclosure is not limited to the embodiments, but may be realized in different forms. The embodiments introduced herein are provided to sufficiently deliver the idea of the present disclosure to those skilled in the art so that the disclosed contents may become thorough and complete.

When it is mentioned in the present disclosure that one element is on another element, it means that a first element may be directly formed on a second element, or a third element may be interposed between the first element and the second element. Further, in the drawings, thicknesses of membranes and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the terms such as "including" and "having" are used to designate the presence of features, numbers, steps, elements, or combinations thereof described in the present disclosure, and shall not be construed to preclude any possibility of presence or addition of one or more other features, numbers, steps, elements, or combinations thereof.

Further, in the following description of the present disclosure, detailed descriptions of known functions and configurations incorporated herein will be omitted when they may make the subject matter of the present disclosure unnecessarily unclear.

Recently, a technique of increasing a size of an entire screen while decreasing a size of a pattern of each individual pixel is being required in the display field.

In accordance with such a current of time, a proximity exposure scheme of transferring a fine pattern of a large-area mask onto a substrate by using the large-area mask having the fine pattern has been used.

However, in the case of the large-area mask, an amount of deflection of the mask caused by a weight thereof may be large, so that a deviation of a separation distance between the large-area mask and the substrate may be increased over an entire exposure area. Accordingly, patterning resolution may be decreased by the deviation of the separation distance.

In addition, since no element should exist on an optical path provided at a gap between the large-area mask and the substrate, it is difficult to directly control the deflection of the large-area mask caused by the weight thereof.

Therefore, an object of the present invention is to provide a device and a method, capable of effectively coping with a decrease in patterning resolution that results from deflection of a mask, particularly a large-area mask, caused by a weight of the mask in proximity exposure.

Hereinafter, in order to achieve the above object, a substrate deforming device for proximity exposure according to an embodiment of the present invention will be described with reference to the drawings.

FIG. 1 is a view for describing a substrate deforming device for proximity exposure according to an embodiment of the present invention, and FIGS. 2 and 3 are views for describing a gap adjustment part according to an embodiment of the present invention.

Referring to FIG. 1, a substrate deforming device for proximity exposure may include a mask holder 10, a position adjustment part 20, a first plate 30, a gap adjustment part 40, a second plate 50, and a control unit 60.

According to one embodiment, the mask holder 10 may be configured such that an exposure mask EM is mounted on the mask holder 10. In detail, as shown in FIG. 1, the mask holder 10 may grip both side portions of the exposure mask EM so that the exposure mask EM may be mounted on the mask holder 10.

Accordingly, even when the exposure mask EM mounted on the mask holder 10 is moved up and down for position adjustment, the mask holder 10 may stably maintain a two-dimensional position of the exposure mask EM that is initially set.

The position adjustment part 20 may adjust the position of the exposure mask EM. In detail, as shown in FIG. 1, when the exposure mask EM is mounted on the mask holder 10, the position adjustment part 20 may move the mask holder 10 on which the exposure mask EM is mounted.

In other words, the position adjustment part 20 may move the position of the mask holder 10 up and down, and as the mask holder 10 moves up and down, the exposure mask EM mounted on the mask holder 10 may move up and down.

The first plate 30 may be configured such that a to-be-exposed substrate ES is mounted on the first plate 30. In detail, the first plate 30 may be configured such that the to-be-exposed substrate ES is mounted on the first plate 30 while being spaced apart from the exposure mask EM in a predetermined direction. In this case, the predetermined direction may be a downward direction of the exposure mask EM.

According to one embodiment, the first plate 30 may be formed of a material that is identical to a material of the exposure mask EM. In addition, the first plate 30 may have the same thickness as the exposure mask EM.

Accordingly, the first plate 30 may have an amount of deflection that is identical to an amount of deflection of the exposure mask EM caused by a weight of the exposure mask EM.

As described above, in the case of the large-area mask, the amount of deflection of the mask caused by a weight thereof may be large, so that the deviation of the separation distance between the large-area mask and the substrate may be increased over the entire exposure area. Accordingly, the patterning resolution may be decreased by the deviation of the separation distance.

However, unlike the above case, according to the embodiment of the present invention, the first plate 30 may be formed of the same material as the exposure mask EM to have the same thickness as the exposure mask EM. Therefore, the first plate 30 may have an amount of deflection that is identical to the amount of deflection of the exposure mask EM caused by the weight of the exposure mask EM, so that a deviation of a separation distance between the to-be-exposed substrate ES mounted on the first plate 30 and the exposure mask EM may be minimized.

Accordingly, the patterning resolution may be improved.

According to the embodiment of the present invention, when the deviation of the separation distance between the to-be-exposed substrate ES mounted on the first plate 30 and the exposure mask EM is generated even though the first plate 30 is formed of the same material as the exposure mask EM to have the same thickness as the exposure mask EM, the deviation may also be minimized.

In order to minimize the deviation of the separation distance described above, the gap adjustment part 40 may be provided.

As shown in FIG. 1, the gap adjustment part 40 may be located on the second plate 50. In detail, a plurality of gap adjustment parts 40 may be provided between the first plate 30 and the second plate 50 in a plane direction of the first plate 30.

In more detail, as shown in FIG. 2, the plurality of gap adjustment parts 40 may be provided on the second plate 50 in the plane direction of the first plate 30.

Referring to FIG. 3, the gap adjustment part 40 may include a main body 41, a first fixing portion 43, a second fixing portion 45, and an adjustment portion 47.

According to one embodiment, the main body 41 of the gap adjustment part 40 may be coupled to one surface of the second plate 50, and the second fixing portion 45 may be coupled to one surface of the first plate 30.

As shown in FIG. 3, the first fixing portion 43, the second fixing portion 45, and the adjustment portion 47 may be provided on the main body 41 in an order of the first fixing portion 43, the adjustment portion 47, and the second fixing portion 45.

After the main body 41 is coupled to one surface of the second plate 50, the first and second fixing portions 43 and 45 may be fixed.

After the first and second fixing portions 43 and 45 are fixed, the adjustment portion 47 may be manipulated (①) to adjust a height of the gap adjustment part 40 (②). For example, when the adjustment portion 47 rotates in a clockwise direction, a distance between the first and second fixing portions 43 and 45 may be increased so that the gap adjustment part 40 may lengthened, whereas when the adjustment portion 47 rotates in a counterclockwise direction, the distance between the first and second fixing portions 43 and 45 may be decreased so that the gap adjustment part 40 may be shortened.

Deformation of the first plate 30 in the plane direction may be controlled by adjusting the height of the gap adjustment part 40. The to-be-exposed substrate ES disposed on the first plate 30 may be deformed according to the control of the deformation of the first plate 30 in the plane direction.

Accordingly, as described above, the deviation that may be generated even though the first plate 30 is formed of the same material as the exposure mask EM to have the same thickness as the exposure mask EM may be minimized.

In addition, as described above, the plurality of gap adjustment parts 40 may be provided, so that the deformation of the first plate 30 in the plane direction may be precisely controlled.

Therefore, the separation distance between the to-be-exposed substrate ES mounted on the first plate 30 and the exposure mask EM may be precisely controlled.

In other words, uniformity of a gap G between the exposure mask EM and the to-be-exposed substrate ES may be increased through the gap adjustment part 40.

Meanwhile, according to another embodiment of the present invention, unlike the configuration in which the gap adjustment part 40 includes the main body 41, the first fixing portion 43, the second fixing portion 45, and the adjustment portion 47, the gap adjustment part 40 may include at least one of a servo motor-based actuator electromagnet suction system, a piezo actuator (PZT actuator), or a voice coil motor.

The control unit 60 may perform a first control and a second control.

In detail, the control unit 60 may perform the first control of reducing a relative distance between the exposure mask EM and the to-be-exposed substrate ES through the position adjustment part 20.

In addition, the control unit 60 may perform the second control of deforming the to-be-exposed substrate ES to correspond to the deflection of the exposure mask EM through the gap adjustment part 40.

To this end, according to the embodiment of the present invention, the substrate deforming device for the proximity exposure may further include a first sensor S1 and a second sensor S2.

The first sensor S1 may measure a position of at least one of the exposure mask EM and the to-be-exposed substrate ES. For example, the first sensor S1 may be a displacement sensor.

Accordingly, even when at least one of the exposure mask EM and the to-be-exposed substrate ES is located at a long distance from the first sensor S1, the first sensor S1 may rapidly measure the position of at least one of the exposure mask EM and the to-be-exposed substrate ES.

The second sensor S2 may measure the gap G between the exposure mask EM and the to-be-exposed substrate ES. For example, the second sensor S2 may be a gap measurement sensor.

Accordingly, the second sensor S2 may have high resolution for precisely measuring the gap G between the exposure mask EM and the to-be-exposed substrate ES.

Since the substrate deforming device for the proximity exposure further includes the first and second sensors S1 and S2, the control unit 60 may perform an operation of reducing the relative distance between the exposure mask EM and the to-be-exposed substrate ES through the position adjustment part 20, that is, the first control according to a measurement result from the first sensor S1.

In addition, the control unit 60 may perform the second control of deforming the to-be-exposed substrate ES to correspond to the deflection of the exposure mask EM through the gap adjustment part 40 according to a measurement result from the second sensor S32 after the first control.

Hereinafter, a substrate deforming method for proximity exposure, which is performed by controlling the substrate deforming device for the proximity exposure through the control unit 60, will be described.

FIG. 4 is a flowchart for describing a substrate deforming method for proximity exposure according to an embodiment of the present invention, FIG. 5 is a view for describing steps S110 and S120 of the present invention, FIG. 6 is a view for describing steps S130 and S140 of the present invention, FIG. 7 is a view for describing a step S150 of the present invention, FIG. 8 is a view for describing a step S160 of the present invention, and FIG. 9 is a view for describing a step S170 of the present invention.

Referring to FIG. 4, the substrate deforming method for the proximity exposure may include a to-be-exposed substrate preparation step S110, a first measurement step S120, an exposure mask preparation step S130, a second measurement step S140, a position adjustment step S150, a third measurement step S160, and a to-be-exposed substrate deformation step S170. Hereinafter, each of the steps will be described in detail.

Step S110

In the step S110, the to-be-exposed substrate ES may be prepared. In detail, as shown in FIG. 5, the to-be-exposed substrate ES may be prepared on the first plate 30. Although not shown, a material to be patterned and a photoresist film may be stacked on the to-be-exposed substrate ES. In addition, the to-be-exposed substrate ES may be formed of a flexible material so as to be deformed together with the first plate 30 according to the deformation of the first plate 30.

As described above, the first plate 30 may be formed of the same material as the exposure mask EM to have the same thickness as the exposure mask EM, so that the first plate 30 may have an amount of deflection that is identical to the amount of deflection of the exposure mask EM caused by the weight of the exposure mask EM.

Accordingly, the deviation of the separation distance between the to-be-exposed substrate ES mounted on the first plate 30 and the exposure mask EM may be minimized.

Step S120

In the step S120, a first measurement may be performed. In detail, the control unit 60 may generate a control signal to perform the first measurement. The first measurement may include measuring a position of the to-be-exposed substrate ES. In this case, the position may be understood to indicate a height of the to-be-exposed substrate ES.

In more detail, as shown in FIG. 5, the first measurement may include acquiring the position of the to-be-exposed substrate ES through the first sensor S1 in a state where the to-be-exposed substrate ES is mounted on the first plate 30.

The control unit 60 may acquire a position of a predetermined point, for example, positions of 20 to 30 points in a plane direction of the to-be-exposed substrate ES through the first sensor S1.

As described above, the first sensor S1 may be a displacement sensor. For example, the displacement sensor may be at least one of a laser-type sensor, a white interference-type sensor, a contact-type (CMM) sensor, and an eddy current-type sensor.

When the first sensor S1 is a laser sensor, a laser of the laser sensor S1 may be directly irradiated to the to-be-exposed substrate ES to rapidly measure the position of the to-be-exposed substrate ES even when the to-be-exposed substrate ES is located at a long distance from the first sensor S1.

In this case, the exposure mask EM may not be mounted on the mask holder 10.

Step S130

In the step S130, the exposure mask EM may be prepared. In detail, the exposure mask EM may be prepared such that the exposure mask EM is mounted on the mask holder 10 to face the to-be-exposed substrate ES.

In this case, the exposure mask EM may be mounted while being spaced apart from the to-be-exposed substrate ES to ensure a sufficient safety distance between the exposure mask EM and the to-be-exposed substrate ES so that a collision between the exposure mask EM and the to-be-exposed substrate ES may be prevented.

As shown in FIG. 6, the mask holder 10 may grip the both side portions of the exposure mask EM so that the exposure mask EM may be mounted on the mask holder 10, so that even when the exposure mask EM mounted on the mask holder 10 is moved up and down for the position adjustment, the mask holder 10 may stably maintain the two-dimensional position of the exposure mask EM that is initially set.

Step S140

In the step S140, a second measurement may be performed. In detail, the control unit 60 may generate a control signal to perform the second measurement. The second measurement may include measuring a position of the exposure mask EM.

In more detail, as shown in FIG. 6, the second measurement may include acquiring the position of the exposure mask EM through the first sensor S1.

The control unit 60 may acquire a position of a predetermined point, for example, positions of 20 to 30 points in a plane direction of the exposure mask EM through the first sensor S1. The point of the step S140 may correspond to the point of the step 120, that is, the same point in the plane direction.

As described above, the first sensor S1 may be a laser sensor.

Accordingly, the laser of the laser sensor S1 may be directly irradiated to the exposure mask EM to rapidly measure the position of the exposure mask EM.

Step S150

In the step S150, the position of at least one of the exposure mask EM and the to-be-exposed substrate ES may be adjusted. In detail, the control unit 60 may generate a control signal to adjust the position.

As shown in FIG. 7, the position of the exposure mask EM may be adjusted so that the relative distance between the exposure mask EM and the to-be-exposed substrate ES becomes a predetermined distance according to measurement results of the first and second measurement steps. For example, the position of the exposure mask EM may be moved in a direction toward the to-be-exposed substrate ES. In other words, the control unit 60 may adjust the position of the exposure mask EM through the position adjustment part 20.

In this case, the position of the to-be-exposed substrate ES may be adjusted to correspond to the predetermined distance (not shown).

In this case, the predetermined distance may be within a measurable distance of the second sensor S2. For example, the predetermined distance may be within 50 μm.

To this end, the control unit 60 may control the position adjustment part 20 so that the distance between the exposure mask EM and the to-be-exposed substrate ES may be within the predetermined distance. In more detail, the control unit 60 may control the position adjustment part 20 so that a distance between the exposure mask EM and the to-be-exposed substrate ES at a point where the distance is greatest may be within the predetermined distance.

As described above, the second sensor S2 may be a gap measurement sensor. For example, the second sensor S2 may be at least one of an electric field-type sensor and a vision-type sensor.

When the second sensor S2 is an electric field sensor, due to characteristics of the electric field sensor, it may be difficult to accurately measure a location of a measurement target in a case where the measurement target is located at a long distance from the electric field sensor.

However, according to an embodiment of the present invention, since the first measurement step S120 and the second measurement step S140 may be performed first, and then the position adjustment step S150 may be performed according to the steps S120 and S140, the position of the exposure mask EM may be adjusted so that the relative distance between the exposure mask EM and the to-be-exposed substrate ES becomes the predetermined distance.

Accordingly, the relative distance between the exposure mask EM and the to-be-exposed substrate ES may be adjusted within the measurable distance of the second sensor S2, for example, the electric field sensor in which measurement at a long distance is not easy.

Step S160

In the step S160, a third measurement may be performed. In detail, the control unit 60 may generate a control signal to perform the third measurement. The third measurement may include measuring a gap G between the exposure mask EM and the to-be-exposed substrate ES after the position adjustment step S150.

As described above in the step S150, the position of the exposure mask EM may be adjusted to correspond to the predetermined distance, so that the next step S160, that is, a step of measuring the gap G between the exposure mask EM and the to-be-exposed substrate ES may be easily performed by using the second sensor.

In this case, as shown by Ga1 to Ga7 in FIG. 8, the gap G between the exposure mask EM and the to-be-exposed substrate ES measured through the third measurement may vary in the plane direction of the to-be-exposed substrate EM.

According to the present invention, the gap G between the exposure mask EM and the to-be-exposed substrate ES may be controlled to be constant in the plane direction of the exposure mask EM.

Hereinafter, the control operation will be described in a step that will be described below.

Step S170

In the step S170, the to-be-exposed substrate ES may be deformed. In detail, the control unit 60 may generate a control signal to deform the to-be-exposed substrate ES.

As shown in FIG. 9, the control unit 60 may deform the to-be-exposed substrate ES so that the gap G between the exposure mask EM and the to-be-exposed substrate ES becomes constant along the plane direction of the to-be-exposed substrate EM according to a measurement result of the third measurement step.

The to-be-exposed substrate ES may be deformed by the gap adjustment part 40.

In detail, as shown in FIG. 9, heights of the plurality of gap adjustment parts 40b1 to 40b8 may be adjusted so that gaps Gb1 to G7 between the exposure mask EM and the to-be-exposed substrate ES are constant in the plane direction of the to-be-exposed substrate EM.

Accordingly, when compared with a state before the step S170, the uniformity of the gap G between the exposure mask EM and the to-be-exposed substrate ES may be increased after the step S170.

In the steps S110 to S170 described above, each of the steps may be controlled through the control unit 60 of the substrate deforming device for the proximity exposure.

Hereinafter, a modified example of the present invention will be described with reference to FIGS. 10 and 11.

FIGS. 10 and 11 are views for describing a modified example of the present invention.

Referring to FIGS. 10 and 11, according to the modified example of the present invention, the first plate 30 may include a convex portion 30a and a concave portion 30b, which are alternately arranged in the plane direction of the first plate 30.

In addition, the convex portion 30a of the first plate 30 may make direct contact with the gap adjustment part 40.

According to the modified example of the present invention, the first plate 30 may include the convex portion 30a and the concave portion 30b, which are alternately arranged, and the convex portion 30a may make direct contact with the gap adjustment part 40, so that the uniformity of the gap G between the exposure mask EM and the to-be-exposed substrate ES may be increased.

This may be because the first plate 30 may be easily deformed since the first plate 30 includes the convex portion 30a and the concave portion 30b, which are alternately arranged. This means that since the concave portion 30b has a thin thickness, the concave portion 30b may have a small deformation resistance, so that the first plate 30 may be easily deformed by the gap adjustment part 40.

In detail, this means that the first plate 30 may be easily deformed to have a shape that is identical to a shape of the exposure mask EM, which is obtained by the deflection of the exposure mask EM caused by the weight of the exposure mask EM.

According to the modified example of the present invention, the first plate 30 may include the convex portion 30a and the concave portion 30b, which are alternately arranged, and the convex portion 30a may make direct contact with the gap adjustment part 40, so that when compared with a state before a plurality of gap adjustment parts 40a1 to 40a8 are driven as shown in FIG. 10, uniformity of the gaps Gb1 to Gb7 between the exposure mask EM and the to-be-exposed substrate ES may be increased after a plurality of gap adjustment parts 40b1 to 40b8 are driven as shown in FIG. 11.

As described above, according to the embodiment and the modified example of the present invention, the decrease in the patterning resolution that results from the deflection of the exposure mask caused by the weight of the exposure mask may be effectively coped with in the proximity exposure.

In other words, the to-be-exposed substrate may be deformed to correspond to the deflection of the exposure mask caused by the weight of the exposure mask, so that the uniformity of the gap between the exposure mask and the to-be-exposed substrate may be increased. Therefore, the patterning resolution in the proximity exposure may be improved.

Although the exemplary embodiments of the present disclosure have been described in detail, the scope of the present disclosure is not limited to a specific embodiment, and should be interpreted by the appended claims. In addition, it should be understood by those of ordinary skill in the art that various changes and modifications can be made without departing from the scope of the present disclosure.

The invention claimed is:

1. A substrate deforming device for proximity exposure, the substrate deforming device comprising:
   a mask holder on which an exposure mask is mounted;
   a first plate spaced apart from the exposure mask in a predetermined direction, and on which a to-be-exposed substrate is mounted;
   a position adjustment part for adjusting a position of the exposure mask;
   a gap adjustment part for adjusting a gap between the exposure mask and the to-be-exposed substrate;
   a first sensor for measuring a position of at least one of the exposure mask and the to-be-exposed substrate;
   a second sensor for measuring the gap between the exposure mask and the to-be-exposed substrate; and
   a control unit for performing a first control of reducing a relative distance between the exposure mask and the to-be-exposed substrate through the position adjustment part according to a measurement result from the first sensor, and a second control of deforming the to-be-exposed substrate to correspond to deflection of the exposure mask through the gap adjustment part according to a measurement result from the second sensor after the first control,
   wherein the first plate and the exposure mask have a same amount of deflection due to own weight, and
   wherein the second control deforms the to-be-exposed substrate to correspond to deflection of the exposure mask through the gap adjustment part after the first plate and the exposure mask are deformed by the own weight.

2. The substrate deforming device of claim 1, wherein the first control includes:
   acquiring the position of the to-be-exposed substrate through the first sensor in a state where the exposure mask is not mounted on the mask holder and the to-be-exposed substrate is mounted on the first plate;
   mounting the exposure mask on the mask holder, and acquiring the position of the exposure mask through the first sensor; and
   reducing a distance between the exposure mask and the to-be-exposed substrate direction through the position adjustment part so that the distance between the exposure mask and the to-be-exposed substrate becomes a predetermined distance.

3. The substrate deforming device of claim 2, wherein the predetermined distance is within a measurable distance of the second sensor.

4. The substrate deforming device of claim 1, wherein, when compared with a state before the second control, uniformity of the gap between the exposure mask and the to-be-exposed substrate is increased after the second control.

5. The substrate deforming device of claim 4, further comprising a second plate on which the gap adjustment part is located,
   wherein a plurality of gap adjustment parts are provided between the first plate and the second plate in a plane direction of the first plate.

6. The substrate deforming device of claim 5, wherein the second control includes controlling deformation of the first plate in the plane direction by adjusting a height of the gap adjustment part, and deforming the to-be-exposed substrate disposed on the first plate according to the control of the deformation of the first plate in the plane direction.

7. The substrate deforming device of claim 1, wherein the first sensor includes a displacement sensor, and
   the second sensor includes a gap measurement sensor.

8. The substrate deforming device of claim 1, wherein the first plate is formed of a material that is identical to a material of the exposure mask.

9. The substrate deforming device of claim 1, wherein the first plate includes a concave portion and a convex portion, which are alternately arranged in a plane direction of the first plate, and
   the gap adjustment part makes direct contact with the convex portion.

10. A substrate deforming method for proximity exposure, the substrate deforming method comprising:
    preparing a to-be-exposed substrate on a first plate;
    a first measurement step of measuring a position of the to-be-exposed substrate;
    preparing an exposure mask facing the to-be-exposed substrate;
    a second measurement step of measuring a position of the exposure mask;
    a position adjustment step of adjusting the position of at least one of the exposure mask and the to-be-exposed substrate so that a relative distance between the exposure mask and the to-be-exposed substrate becomes a predetermined distance according to measurement results of the first and second measurement steps;
    a third measurement step of measuring a gap between the exposure mask and the to-be-exposed substrate after the position adjustment step; and
    deforming the to-be-exposed substrate so that the gap between the exposure mask and the to-be-exposed substrate becomes constant in a plane direction of the exposure mask according to a measurement result of the third measurement step, wherein the first plate and the exposure mask have a same amount of deflection due to own weight, wherein the deforming of the to-be-exposed substrate includes deforming the to-be-exposed substrate to correspond to deflection of the exposure mask through the gap adjustment part after the first plate and the exposure mask are deformed by the own weight.

11. The substrate deforming method of claim 10, wherein the first measurement step and the second measurement step are performed by a displacement sensor, and the third measurement step is performed by a gap measurement sensor.

12. The substrate deforming method of claim 11, wherein the predetermined distance is within a measurable distance of the gap measurement sensor.

13. The substrate deforming method of claim 10, wherein uniformity of a gap between the exposure mask and the to-be-exposed substrate is increased by the deforming of the to-be-exposed substrate.

* * * * *